(12) United States Patent
Hu et al.

(10) Patent No.: US 9,842,646 B2
(45) Date of Patent: Dec. 12, 2017

(54) MEMRISTOR APPARATUS WITH VARIABLE TRANSMISSION DELAY

(71) Applicant: Hewlett Packard Enterprise Development LP, Houston, TX (US)

(72) Inventors: Miao Hu, Palo Alto, CA (US); Ning Ge, Palo Alto, CA (US); John Paul Strachan, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,555

(22) PCT Filed: Apr. 28, 2015

(86) PCT No.: PCT/US2015/028044
§ 371 (c)(1),
(2) Date: Jan. 31, 2017

(87) PCT Pub. No.: WO2016/175770
PCT Pub. Date: Nov. 3, 2016

(65) Prior Publication Data
US 2017/0221558 A1 Aug. 3, 2017

(51) Int. Cl.
*G11C 11/00* (2006.01)
*G11C 13/00* (2006.01)
(52) U.S. Cl.
CPC ........ *G11C 13/004* (2013.01); *G11C 13/0038* (2013.01); *G11C 13/0061* (2013.01); *G11C 13/0004* (2013.01); *G11C 2213/75* (2013.01)

(58) Field of Classification Search
CPC .............. G11C 13/004; G11C 13/0061; G11C 13/0038; G11C 2213/75
USPC ............... 365/63, 148, 158, 149, 233.1, 194
See application file for complete search history.

(56) References Cited

U.S. PATENT DOCUMENTS

| | | |
|---|---|---|
| 2011/0051310 A1 | 3/2011 | Strachan et al. |
| 2012/0011088 A1 | 1/2012 | Aparin et al. |
| 2012/0011092 A1 | 1/2012 | Tang et al. |
| 2012/0308136 A1 | 12/2012 | Izhikevich |
| 2014/0143193 A1 | 5/2014 | Zheng et al. |

(Continued)

OTHER PUBLICATIONS

International Searching Authority, The international Search Report and the Written Opinion, PCT/US2015/023044, Feb. 23, 2016, 11 Pages.

(Continued)

*Primary Examiner* — David Lam
(74) *Attorney, Agent, or Firm* — Mannava & Kang, P.C.

(57) ABSTRACT

In an example, a memristor apparatus with variable transmission delay may include a first memristor programmable to have one of a plurality of distinct resistance levels, a second memristor, a transistor connected between the first memristor and the second memristor, and a capacitor having a capacitance, in which the capacitor is connected between the first memristor and the transistor. In addition, application of a reading voltage across the second memristor is delayed by a time period equivalent to the programmed resistance level of the first memristor and the capacitance of the capacitor.

15 Claims, 7 Drawing Sheets

(56) References Cited

U.S. PATENT DOCUMENTS

2014/0214738 A1 7/2014 Pickett
2014/0358834 A1* 12/2014 Kim ................. G06N 3/049
706/25

OTHER PUBLICATIONS

Lecerf, G., et al., Silicon Neuron Dedicated to Memristive Spiking Neural Networks, Feb. 7, 2014, IEEE, pp. 1568-1571.
Li, Y., et al., Ultrafast Synaptic Events in a Chalcogenide Memristor, Apr. 8, 2013, Nature, Scientific Reports, vol. 3, No. 1619, DOI: 10.1038, 7 pages.
Wang, Z., et al., A 2-transistor/1-resistor Artificial Synapse Capable of Communication and Stochastic Learning in Neuromorphic Systems, Jan. 15, 2015, Frontiers in Neuroscience, vol. 8, Article 438, 11 pages.
Wang, R.M., et al., A Mixed-signal Implementation of a Polychronous Spiking Neural Network with Delay Adaptation, Mar. 18, 2014, Frontiers in Neuroscience, vol. 8, Article 51, 16 pages.
Zhang, Y., et al., Implementation of Memristive Neural Networks with Spike-rate-dependent Plasticity Synapses, Jul. 6-11, 2014, 2014 International Joint Conference on Neural Networks (IJCNN), IEEE, pp. 2226-2233.

* cited by examiner

MEMRISTOR APPARATUS WITH VARIABLE TRANSMISSION DELAY

STATEMENT OF GOVERNMENT RIGHTS

This invention was made with Government support. The Government has certain rights in the invention.

BACKGROUND

Memristors are devices that can be programmed to different resistive states by applying a programming energy, for example, a voltage or current pulse. The programming energy generates a combination of electric field and thermal effects that are to modulate the conductivity of both non-volatile switch and non-linear select functions in a switching element. After programming, the state of the memristor remains stable over a specified time period and the state is thus readable. Memristor elements can be used in a variety of applications, including non-volatile solid state memory, programmable logic, signal processing, control systems, pattern recognition, and other applications.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
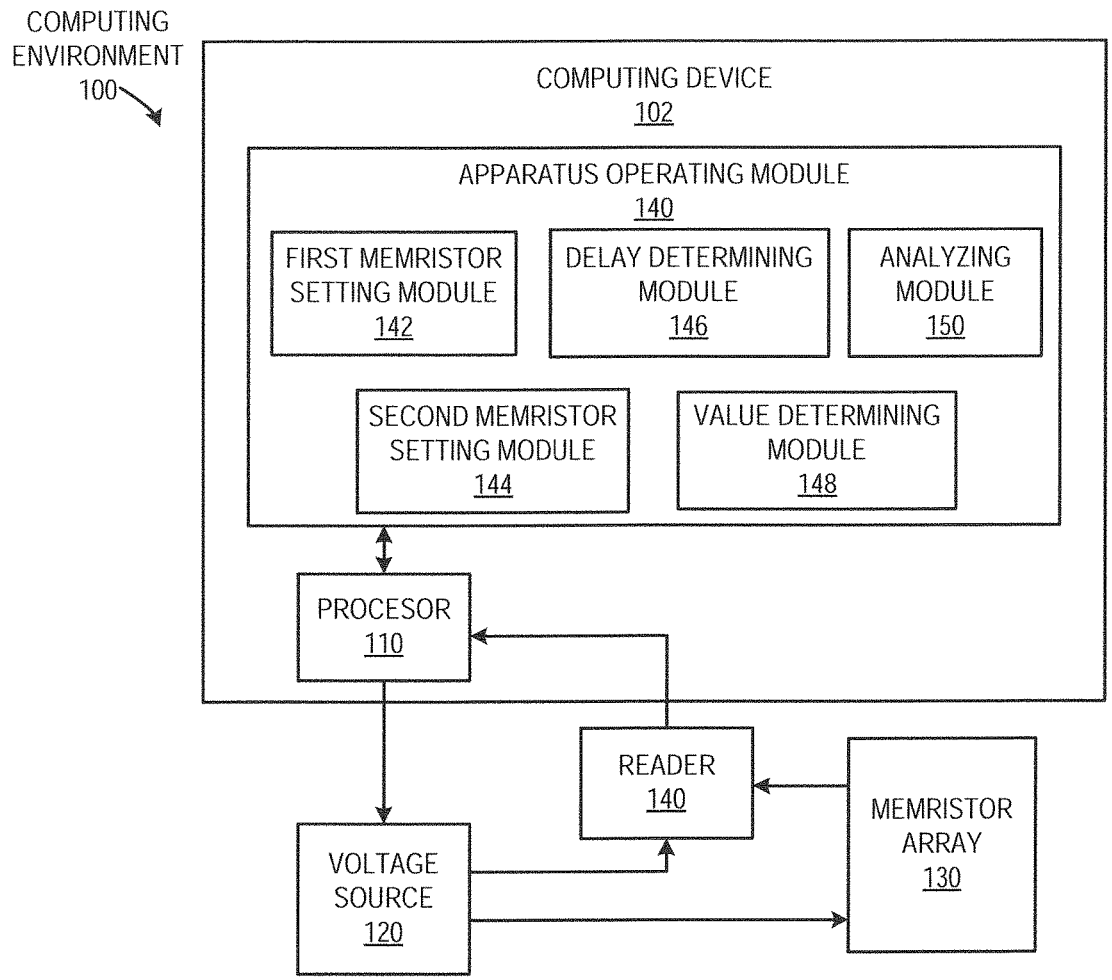
FIG. 1 shows a simplified block diagram of a computing environment in which a memristor apparatus with variable transmission delay disclosed herein may be implemented, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Disclosed herein is memristor apparatus with variable transmission delay and a crossbar array including a plurality of the memristor apparatuses. Each of the memristor apparatuses includes a first memristor and a second memristor, with a transistor positioned between the first memristor and the second memristor, and with a capacitor position between the first memristor and the transistor. Particularly, in each of the memristor apparatuses, the gate of the transistor may be connected to the output of the first memristor and the capacitor such that the transistor gate turns on when the capacitance level of the capacitor has reached a certain level. In addition, the capacitor may receive a voltage at a voltage level corresponding to the resistance level of the first memristor. That is, the capacitor may reach the certain level of capacitance relatively faster when the resistance level of the first memristor is lower as compared to when the resistance level of the first memristor is higher. In this regard, the resistance level of the first memristor may be controlled to control the delay at which the transistor gate is turned on.

In each of the memristor apparatuses, the source of the transistor may be connected to a voltage supply and the drain of the transistor may be connected to the second memristor. In this regard, the transistor may prevent the supply of voltage to the second memristor until the transistor gate has been turned on through receipt of a voltage from the capacitor. In addition, the second memristor may be programmed to have a predetermined resistance level, in which the resistance level corresponds to a data. Moreover, the first memristor may also be programmed to have a predetermined resistance level, in which the resistance level of the first memristor controls the delay in which the voltage is applied through the second memristor. The delay and the change in voltage across the second memristor may thus correspond to a data value. As the first memristor may be programmed to have any of a number of predetermined resistance levels, the memristor apparatuses disclosed herein may store a relatively larger amount of information as compared to memristor apparatuses that contain a single memristor while occupying the same or substantially the same amount of space.

According to an example, the memristor apparatuses disclosed herein may provide a hardware platform to implement an artificial neural network, such as the spiking neural network. Generally speaking, the spiking neural network incorporates time as well as neuronal and synaptic state from which computational function may emerge in the neural network. Particularly, spiking neural networks operate on the basis that neurons generate spikes at a particular time based on the state of the neuron and that the time is important to neuron function. When a neuron generates a spike, the spike travels to other neurons, which may adjust their states based on the time that the spike is received. In this regard, the memristor apparatuses disclosed herein may integrate synapse design with controllable transmission delay and synaptic weight.

According to an example, the memristor apparatuses disclosed herein may have areas similar to those of memristor apparatuses having a single transistor and memristor design. For instance, the capacitor may be integrated with the first memristor and the combined first memristor and capacitor may be integrated with the gate layer of the transistor. In addition, the second memristor may be integrated with the drain layer of the transistor.

With reference first to FIG. 1, there is shown a simplified block diagram of a computing environment 100 in which a memristor apparatus with variable transmission delay disclosed herein may be implemented, according to an example. It should be understood that the computing environment 100 depicted in FIG. 1 may include additional components and that some of the components described herein may be removed and/or modified without departing from a scope of the computing environment 100.

As shown in FIG. 1, the computing environment 100 may include a computing device 102, a voltage source 120, a memristor array 130, and a reader 140. The computing device 102 may also include a processor 110 and an apparatus operating module 140. The memristor array 130 may also be referenced as a memory device array, an apparatus array, etc. In addition, the processor 110 may be a central processing unit (CPU), a microprocessor, a micro-controller, an application specific integrated circuit (ASIC), a processor core, or the like. Although not explicitly shown, the computing device 102 may include multiple processors 110 and the computing environment 100 may include multiple voltage sources 120, multiple memristor arrays 130, multiple readers 140, or combinations thereof. According to an example, the components of the computing environment 100 depicted in FIG. 1 may be attached to an integrated circuit chip.

As discussed herein, the memristor array 130 may be formed of a crossbar array in which memristor apparatuses are formed at junctions of the crossbar array. As also discussed herein, the processor 110 may store data in the memristor apparatuses, which are also referred to as "apparatuses" herein. In one regard, the voltage source 120, which may be connected to a power supply (not shown) may apply a writing voltage (or writing current) across voltage lines in the crossbar array to program the memristor apparatuses by setting the resistance levels of the memristors in the memristor apparatuses as instructed by the processor 110. In another regard, the voltage source 120 may apply reading voltages (or reading currents) across the voltage lines to enable the reader 140 to read the resistance values of the respective memristors in the memristor apparatuses and the reader 140 may forward the read resistance values to the processor 110. In a further regard, the voltage source 120 may apply rewriting voltages (or rewriting currents), e.g., in a reverse polarity, to clear the resistance levels of the memristors in the memristor apparatuses, such that the memristors may be re-programmed.

The apparatus operating module 140 is depicted as including a first memristor setting module 142, a second memristor setting module 144, a delay determining module 146, a value determining module 148, and an analyzing module 150. The processor 110 may execute or otherwise implement the apparatus operating module 140. The apparatus operating module 140 may be a set of machine readable instructions that is stored on a hardware device. In an example, the apparatus operating module 140 is the hardware device. In any regard, the hardware device may be, for instance, a volatile or non-volatile memory, such as dynamic random access memory (DRAM), electrically erasable programmable read-only memory (EEPROM), magnetoresistive random access memory (MRAM), memristor, flash memory, floppy disk, a compact disc read only memory (CD-ROM), a digital video disc read only memory (DVD-ROM), or other optical or magnetic media, and the like, on which software may be stored. In this example, the modules 142-150 may be software modules, e.g., sets of machine readable instructions, stored in the hardware device. According to a particular example, the apparatus operating module 140 is a set of machine readable instructions stored in the memristor array 130.

In another example, the apparatus operating module 140 may be a hardware component, such as a chip component, an integrated circuit component, etc., and the modules 142-150 may be hardware modules on the hardware component. In a further example, the modules 142-150 may be a combination of software and hardware modules.

In any regard, the processor 110 may implement or execute the modules 142-150 to write data into and read data from the memristor array 130. Particularly, the processor 110 may implement the modules 142-150 to program a first memristor to have a first memristor resistance value and a second memristor to have a second memristor resistance value. The first memristor resistance value may correspond to desired delay in the flow of a voltage from the first memristor to the second memristor. In addition, the second memristor resistance value may correspond to a data value. The delay in the flow of the voltage may provide for additional data to be stored in a memristor apparatus as compared to a conventional memristor apparatus that includes a single memristor. Various manners in which variable transmission delays and weights may be added to signals outputted from the memristor apparatuses are described in greater detail below.

Figure 2:
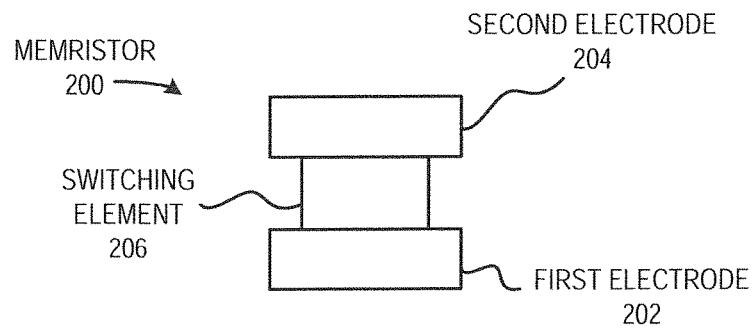
FIG. 2 shows a simplified diagram of a memristor that may form memristor elements in the memristor array depicted in FIG. 1, according to an example of the present disclosure.

Turning now to FIG. 2, there is shown a simplified diagram of a memristor 200 that may form memristor elements in the memristor array 130 depicted in FIG. 1 according to an example. It should be understood that the diagram of the memristor 200 depicted in FIG. 2 is a generalized illustration and that the memristor 200 discussed herein may include additional components and that some of the components described herein may be removed and/or modified without departing from scope of the memristors disclosed herein.

The memristor 200 may generally be defined as an electrically actuated apparatus formed of a first electrode 202, a second electrode 204, and a switching element 206. As shown, the second electrode 204 may be spaced from the first electrode 202 and the switching element 206 may be positioned between the first and second electrodes 202, 204. The first electrode 202 may be formed of an electrically conductive material, such as AlCu, AlCuSi, AlCuSi with a barrier layer, such as TiN, or the like. The second electrode 204 may be formed of any of the example materials listed for the first electrode 202. In addition, the second electrode 204 may be formed of the same or different materials as compared with the first electrode 202. For instance, the second electrode 204 may be formed of an electrically conductive material, such as TaAl, WSiN, AlCu combination, or the like.

The switching elements 206 may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc.

The resistance level of the memristor 200 may be changed in response to various programming conditions and the memristor 200 is able to exhibit a memory of past electrical conditions. For instance, the memristor 200 may be programmed to have one of a plurality of distinct resistance levels. Particularly, the resistance level of the switching element 206 may be changed through application of an electrical field, e.g., through application of a current or voltage, in which the current or voltage may cause mobile dopants in the switching element 206 to move and/or change the status of conducting channel(s) in the switching element 206, which may alter the resulting electrical operation of the memristor 200. That is, for instance, the distinct resistance levels of the switching element 206, and thus the memristor 200, may correspond to different programming current levels or voltage amplitudes applied to the switching element 206. By way of example, the switching element 206 may be programmed to have a higher resistance level through application of an earlier current or voltage level.

After removal of the current or voltage, the locations and characteristics of the dopants or conducting channels are to remain stable until the application of another programming electrical field. That is, the switching element 206 remains at the programmed resistance level following removal of the current or voltage. As discussed in greater detail below, in one example, the resistance level of the switching element 206, and thus the memristor 200, may be programmed to apply a delay in the transmission of a voltage (or equivalently current) through a capacitor and to the gate of a transistor. In another example, the resistance level of the switching element 206, and thus the memristor 200, may be programmed to apply a weight to the voltage (or equivalently current) transmitted through the memristor 200. When performing a reading operation of the memristor 200, a reading voltage (or current) that is lower than a writing voltage (or current) may be applied across the memristor 200. That is, the reading voltage (or current) may be of sufficiently low electrical field strength to prevent significant dopant motion or conducting channel modification in the switching element 206.

Figure 3A:
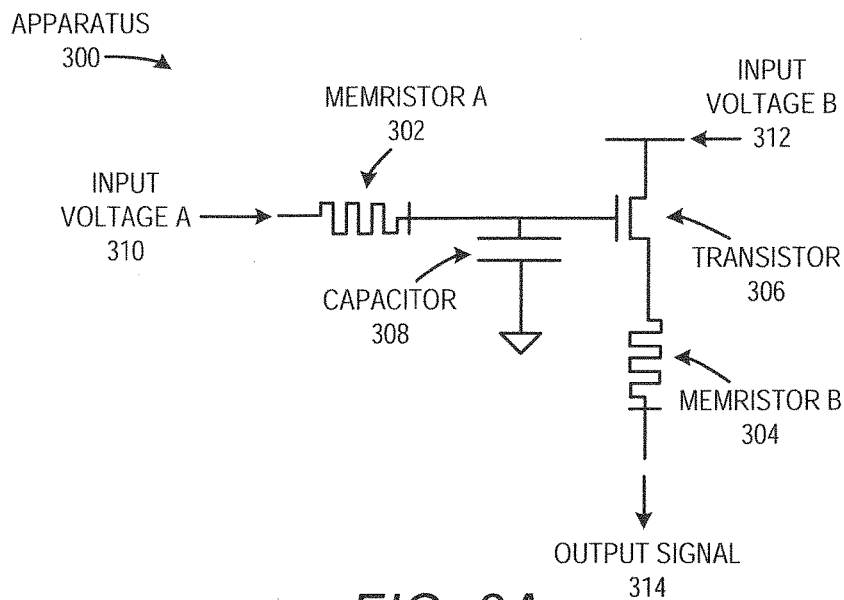
FIGS. 3A and 3B respectively show circuit diagrams of apparatuses with variable transmission delays, according to two examples of the present disclosure.
Figure 3B:
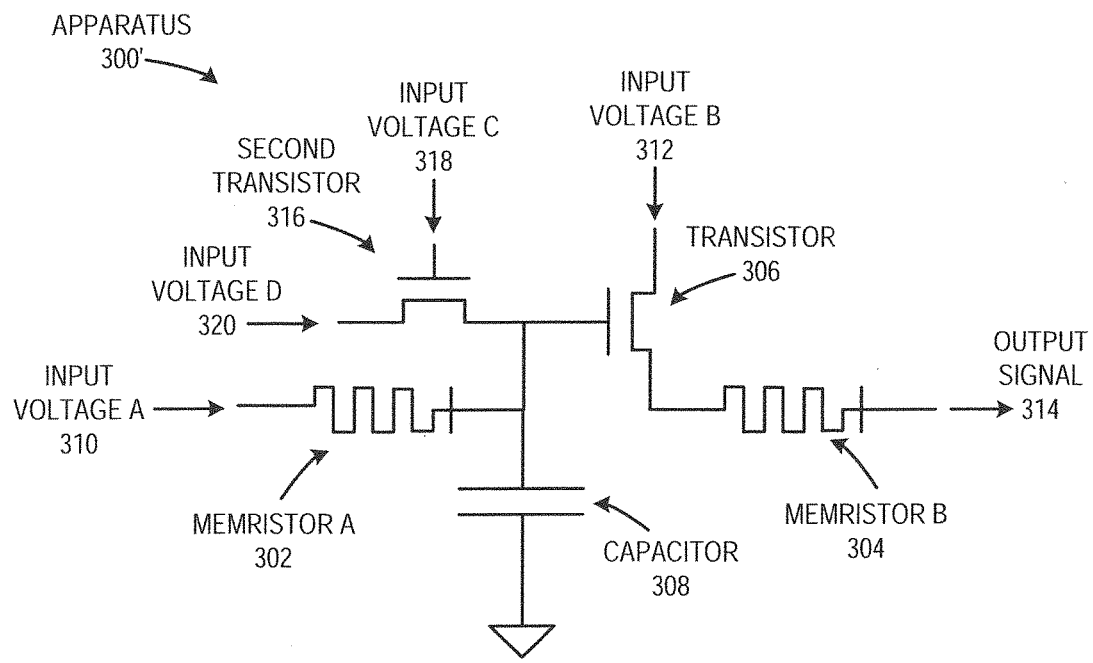

Turning now to FIGS. 3A and 3B, there are respectively shown circuit diagrams of apparatuses with variable transmission delays 300, 300' according to two examples. It should be understood that the apparatuses 300 depicted in FIGS. 3A and 3B may include additional components and that some of the components described herein may be removed and/or modified without departing from scopes of the apparatuses 300, 300'.

With reference first to FIG. 3A, the apparatus 300 is depicted as including a first memristor 302, a second memristor 304, a transistor 306, and a capacitor 308. The first memristor 302 and the second memristor 304 may be similar to the memristor 200 depicted in FIG. 2. That is, each of the first memristor 302 and the second memristor 304 may be programmed to have one of multiple available resistance levels and the resistance level of the first memristor 302 may differ from the resistance level of the second memristor 304.

As also shown, the output of the first memristor 302 may be connected to the capacitor 308 and the gate of the transistor 306. In addition, the drain of the transistor 306 may be connected to an input of the second memristor 304. As further shown, a first input voltage 310 may be supplied to an input of the first memristor 302 and a second input voltage 312 may be supplied to the source of the transistor 306. Although not shown, the output of the second memristor 304 may be connected to a signal line through which an output signal 314 from the second memristor 304 may be read.

In operation, the first input voltage 310 may be applied while the second input voltage 312 is being applied. In one example, the first input voltage 310 may be supplied as a voltage pulse or spike while the second input voltage 312 is being applied. As shown in FIG. 3A, the first input voltage 310 is supplied into the input of the first memristor 302 and the second input voltage 312 is supplied into the source of the transistor 306. The amount of time it takes for the first input voltage 310 to reach the gate of the transistor 306 may depend upon the resistance level at which the first memristor 302 has been set or programmed and the capacitance level of the capacitor 308. That is, the higher the resistance level of the first memristor 302, the longer it will take for the capacitor 308 to be charged and thus, the longer it will take for the capacitor 308 to release a charge to the gate of the transistor 306. Once the capacitor 308 reaches its capacitance level, the capacitor 308 may output a voltage to the gate of the transistor 306. At that point, the transistor 306 may receive a sufficient voltage at the gate, which may turn on the gate. The voltages applied across the gate and the source of the transistor 306 may cause a conductive channel to be created between the source and the drain thereby causing a voltage to be outputted through the drain of the transistor 306.

The voltage outputted from the transistor 306 and into the input of the second memristor 304 may also be referred to herein as a reading voltage or a reading signal. The reading signal may be transmitted through the second memristor 304 and may be affected by the resistance level at which the second memristor 304 has been set or programmed. For instance, the voltage level of the reading signal may be reduced by the resistance level of the second memristor 304. In this regard, the resistance level of the second memristor 304 may apply a weight to the reading signal, which may represent a data value such as a "1" or a "0".

The time at which the reading signal is supplied to the input of the second memristor 304 with respect to the time at which the first input voltage 310 was applied to the input of the first memristor 302 may thus be delayed by the amount of time it took for the first input voltage 310 to reach the gate of the transistor 306 through the first memristor 302 and the capacitor 308. The apparatus 300 may thus store information in both the first memristor 302 and the second memristor 304. That is, the time period of the delay caused by the resistance level of the first memristor 302 and the weighting applied to a reading signal cause by the resistance level of the second memristor 304 may represent a data value. For instance, a reading signal having a first time period delay and a first weight may represent a first value, a reading signal having a second time period delay and a first weight may represent a second value, and so forth.

The plurality of distinct resistance levels of the first memristor 302 may be equivalent to a precision level at which the delay is detectable across a reading voltage pulse. That is, if a reading voltage pulse is 7 ms long and a reading device, such as the reader 140, depicted in FIG. 1 is accurate to 1 ms, then the memristor 302 may be programmed to have 7 distinct resistance levels, which may represent 7 distinct values. In addition, in this example, if the second memristor 304 is programmable between two states, then the combination of the first memristor 302 and the second memristor 304 may store up 14 distinct values.

According to an example, a plurality of apparatuses 300 may be arranged in the memory array 130 depicted in FIG. 1 to provide a spiking neural network. Generally speaking, a spiking neural network may carry much more bits of information than traditional encoding methods, while using the same or smaller amount of energy. As such, the apparatuses 300 disclosed herein may provide hardware that enables a spiking neural network having a relatively high power efficiency to be realized.

As discussed above with respect to FIG. 2, the resistance level of the memristor 200 may be programmed or set through application of a writing voltage (or writing current) across the memristor 200, which may be relatively higher than the reading voltage (or reading current). Similarly, the resistance level of the second memristor 304 may be programmed or set through application of a writing voltage (second input voltage 312) (or writing current) across the second memristor 304 while a first input voltage 310 is applied to the gate of the transistor 306. In addition, the resistance level of the first memristor 302 may be programmed or set through application of a writing voltage (first input voltage 310) (or writing current) across the first memristor 302 if the programming of the first memristor 302 is voltage dependent. As an example to improve the fine programming of the first memristor 302, FIG. 3B depicts an additional transistor 316 and input voltage 318 that provides additional control during the programming of the first memristor 302. The additional transistor 316 and input voltage 318 may be provided in instances in which the programming of the first memristor 302 is not voltage dependent but current dependent.

Turning now to FIG. 3B, the apparatus 300' may include the same components as the apparatus 300 depicted in FIG. 3A and may also include a second transistor 316. As shown in FIG. 3B, a third input voltage 318 may be supplied to the gate of the second transistor 316 and a fourth input voltage 320 may be supplied to the source of the second transistor 316. The fourth input voltage 320 may be a fixed voltage supply level (Vdd), and thus the second transistor 316 may act as a voltage controlled current source, in which the third input voltage 318 sets the maximum supplied current during programming. In this regard, the first memristor 302 may be programmed to have a resistance level based upon the voltage level of the third input voltage 318, which decides the current compliance of the first memristor 302. As another example, the first memristor 302 may be programmed to have a resistance level based upon the writing voltage level of the first input voltage 310 and current level established by the third input voltage 318. For instance, the third input voltage 318 may be set to be at a higher level to program the first memristor 302 with higher current levels and achieve a relatively lower resistance level.

Figure 4A:
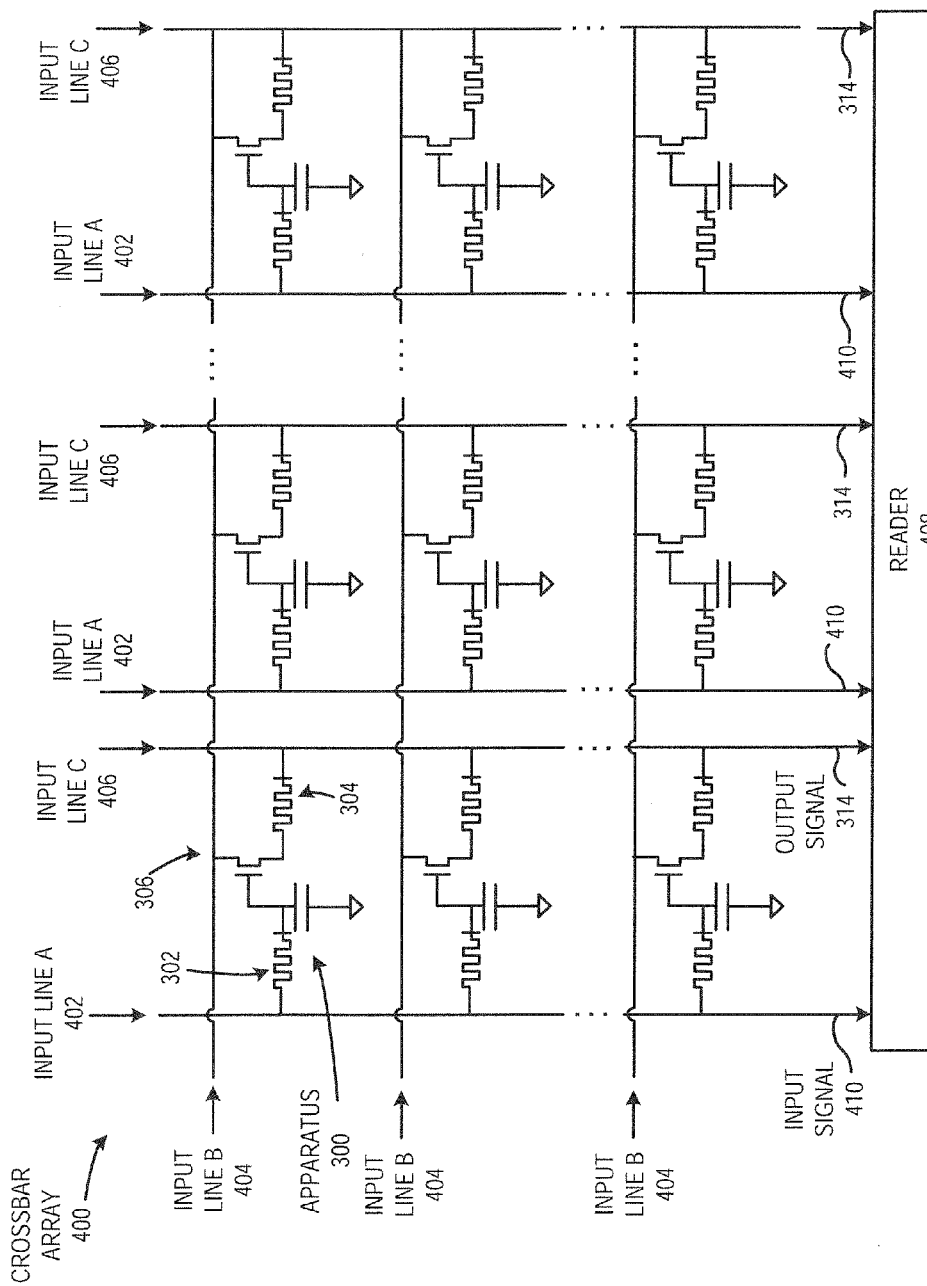
FIGS. 4A and 4B respectively show diagrams of crossbar arrays that each includes the apparatuses depicted in FIGS. 3A and 3B formed at junctions of the crossbar arrays, according to two examples of the present disclosure.
Figure 4B:
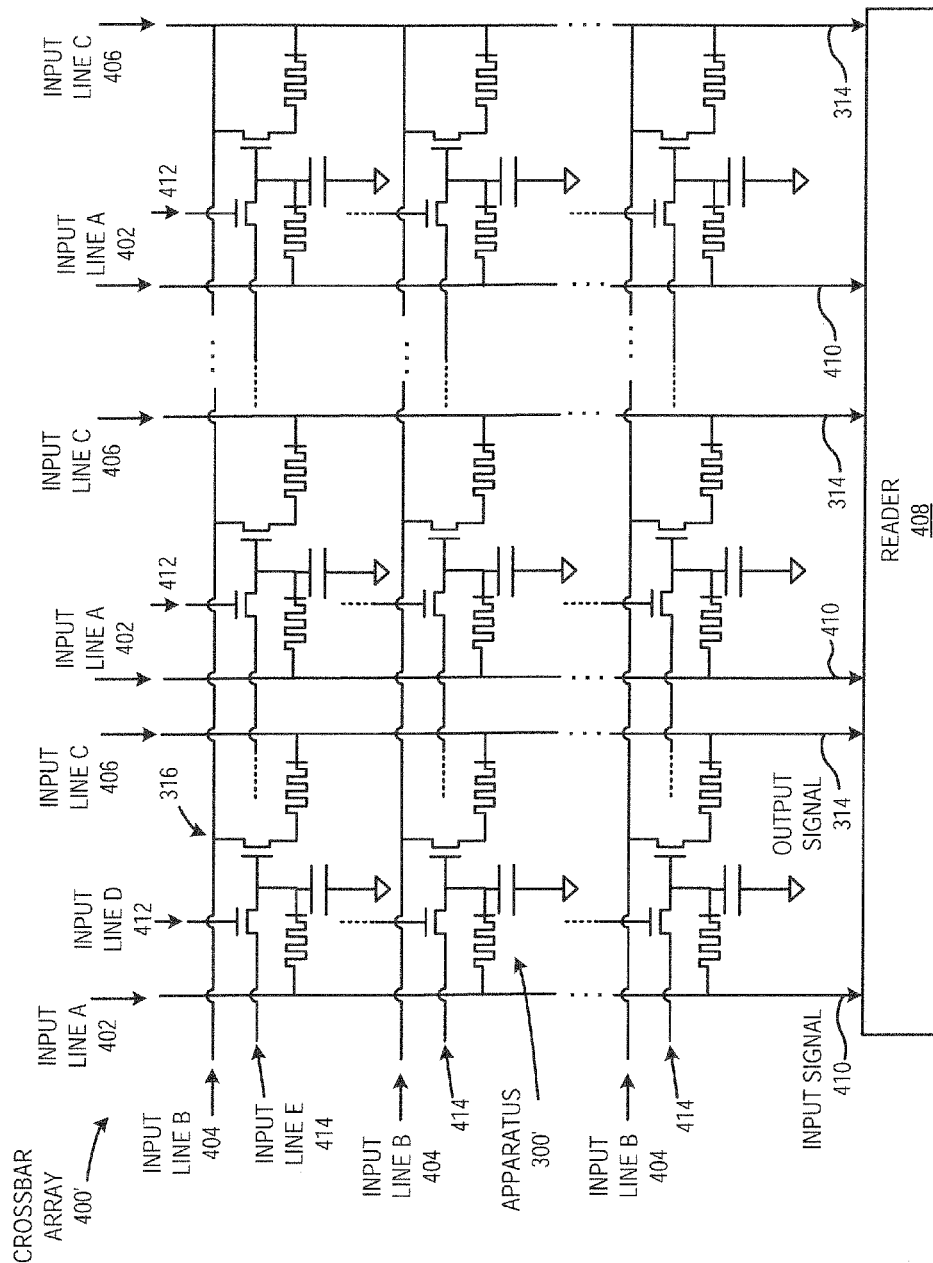

With reference now to FIGS. 4A and 4B, there are respectively shown diagrams of crossbar arrays 400, 400' that each includes the apparatuses 300, 300' formed at junctions of the crossbar arrays 400, 400', according to two examples. Particularly, the crossbar array 400 depicted in FIG. 4A includes the apparatuses 300 depicted in FIG. 3A and the crossbar array 400' depicted in FIG. 4B includes the apparatuses 300' depicted in FIG. 3B. It should be understood that the diagrams of the crossbar arrays 400, 400' depicted in FIGS. 4A and 4B are generalized illustrations and that the crossbar arrays 400, 400' discussed herein may include additional components and that some of the components described herein may be removed and/or modified without departing from scopes of the crossbar arrays 400, 400' disclosed herein.

According to an example, the memristor array 130 depicted in FIG. 1 may include either or both of the crossbar arrays 400, 400' depicted in FIGS. 4A and 4B. In addition, the memristor array 130 may include any number of crossbar arrays 400, 400'.

As shown in FIG. 4A, the crossbar array 400 includes a plurality of apparatuses 300, a plurality of first input lines 402, a plurality of second input lines 404, and a plurality of third input lines 406. The ellipses " . . . " indicate that the crossbar array 400 may include any number of apparatuses 300, first input lines 402, second input lines 404, and third input lines 406. The first input lines 402 are depicted as being connected to the inputs of the first memristors 302 and the second input lines 404 are depicted as being connected to the inputs (sources) of the transistors 306. In addition, the third input lines 406 are depicted as being connected to the outputs of the second memristors 304.

Each of the first input lines 402 and the second input lines 404 may be connected to a voltage source (not shown), such as the voltage source 120 depicted in FIG. 1. The third input lines 402 may also be connected to a voltage source or may be connected to ground. According to an example, each of the apparatuses 300 may be individually addressed by applying voltage to selected ones of the first and second input lines 402, 404. As discussed above, a writing voltage may be supplied through selected ones of the first and second input lines 402, 404 to program the first memristors 302 and the second memristors 304 in selected ones of the apparatuses 300. In addition, a reading voltage may be supplied through selected ones of the first and second input lines 402, 404 to cause current to flow through selected ones of the apparatuses 300. The writing voltage may be relatively higher than the reading voltage such that the reading voltage may not cause the resistance levels of the first and second memristors 302, 304 in an apparatus 300 to be changed as a result of a reading operation.

The first input lines 402 and the third input lines 406 are also depicted as being connected to a reader 408, which may be equivalent to the reader 140 depicted in FIG. 1. The reader 408 is also depicted as receiving an input signal 410 from the first input line 402 and an output signal 314 from the third input line 406. According to an example, the reader 408 may use the input signal 410 from the first input line 402 to determine a base time at which a voltage is supplied to the first memristor 302 of an apparatus 300. In addition, the reader 408 may determine a time at which the output signal 314 from the apparatus 300 was received. The reader 408 may compare the time at which the output signal 314 was received to the time at which the input signal 410 was received to determine the time period of the delay between application of the input voltage into the first memristor 302 of the apparatus 300 and the output of the reading voltage from the second memristor 304. The reader 408 may also determine the amount of voltage loss in the reading voltage value of the output signal 314 by determining, for instance, the voltage level of the output signal 314 compared to the voltage level of the reading signal applied to the source of the transistor 306 through the second input voltage line 404. The reader 408 may also communicate the determined time period delay and the read voltage difference to a processor, such as the processor 110 depicted in FIG. 1. The processor 110 may analyze the determined time period delay and the read voltage difference to determine the data value or information stored in the apparatus 300.

Turning now to FIG. 4B, the crossbar array 400' is depicted as including a plurality of apparatuses 300' arranged between the first input lines 402, the second input lines 404, and the third input lines 406. The first input lines 402, the second input lines 404, and the third input lines 406 are depicted as being connected to respective components of the apparatuses 300' in similar fashion to the crossbar array 400 depicted in FIG. 4A. However, the crossbar array 400' depicted in FIG. 4B differs from the crossbar array 400 depicted in FIG. 4A in that the crossbar array 400' may include a plurality of fourth input lines 412 and a plurality of fifth input lines 414. As shown, the fourth input lines 412 may be connected to the gates of the second transistors 316 and the fifth input lines 414 may be connected to the sources of the second transistors 316. In this regard, input voltages may selectively be supplied to the second transistors 316 of the apparatuses 100' to program the first memristors 302 as described above with respect to FIG. 3B. The fourth input lines 412 and the fifth input lines 414 may also be connected to the voltage source 120 or to another voltage source (not shown).

According to an example, the first memristors 302 in each of the apparatuses 300, 300' are integrated into the respective gate layers of the transistors 306. In another example, the capacitors 308 in each of the apparatuses 300, 300' are integrated into the respective gate layers of the transistors 306. In a further example, both the first memristors 302 and the capacitors 308 in each of the apparatuses 300, 300' are integrated into the respective gate layers of the transistors 306. In these examples, the respective sizes of the apparatuses 300, 300' may be substantially be minimized, for instance, the apparatuses 300, 300' may have similar areas as apparatuses that do not include the first memristors 302. Additionally, the second memristors 304 in each of the apparatuses 300, 300' may be integrated into the respective drain layers of the transistors 306.

Figure 5:
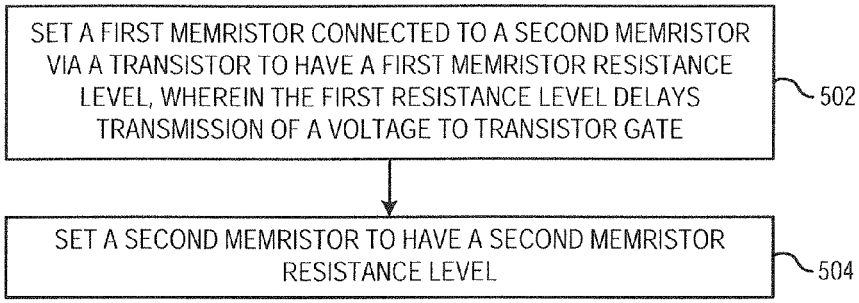
FIGS. 5 and 6, respectively show flow diagrams of methods for operating a memristor apparatus with variable transmission delay, according to two examples of the present disclosure.
Figure 6:
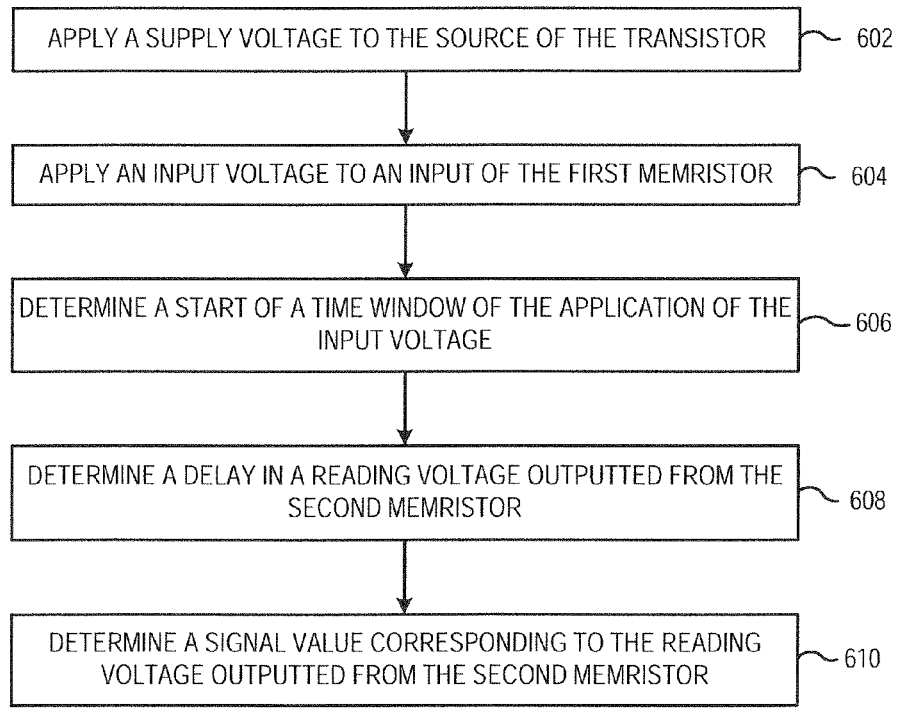

With reference now to FIGS. 5 and 6, there are respectively shown flow diagrams of methods 500 and 600 for operating a memristor apparatus 300, 300' with variable transmission delay, according to two examples. It should be understood that the methods 500 and 600 depicted in FIGS. 5 and 6 may include additional operations and that some of the operations described herein may be removed and/or modified without departing from the scopes of the methods 500 and 600. The descriptions of the methods 500 and 600 are made with reference to the features depicted in FIGS. 1-4B for purposes of illustration and thus, it should be understood that the methods 500 and 600 may be implemented in apparatuses having architectures different from those shown in those figures.

With reference first to FIG. 5, at block 502, a first memristor 302 may be set to have a first memristor resistance level corresponding to one of a plurality of available time delays. For instance, the processor 110 may implement the first memristor setting module 142 to determine the first memristor resistance level to which the first memristor 302 is to be set. As described above, the first memristor resistance level may correspond to information or a data value to be stored in the first memristor 302. In addition, the processor 110 may cause a writing voltage to be applied across the first memristor 302 to set or program the first memristor 302 to have the first memristor resistance level.

At block 504, a second memristor 304 may be set to have a second memristor resistance level corresponding to a one of a plurality of available resistance levels. According to an example, the available resistance levels may include a first resistance level representing the value "0" and a second resistance level representing the value "1". The processor 110 may, for instance, implement the second memristor setting module 144 to determine the second memristor resistance level to which the second memristor 304 is to be set. As described above, the first memristor resistance level may correspond to information or a data value to be stored in the second memristor 304. In addition, the processor 110 may cause a writing voltage to be applied across the second memristor 304 to set or program the second memristor to have the second memristor resistance level as also described above.

According to an example, a sufficiently high current compliance may be set on the first and second memristors 302 and 304 to enable the resistance states of the first and second memristors 302 and 304 to be switched through application of the writing voltages (or writing currents).

The method 500 depicted in FIG. 5 generally pertains to the storage of data through the setting of the first and second memristor 302, 304 resistance levels. Turning now to FIG. 6, the method 600 generally pertains to the reading of the set resistance levels and determining a signal value corresponding to the read resistance levels. In this regard, the method 600 may be implemented following the setting of the first and second memristor 302, 304 resistance levels in the method 500. Additionally, the method 500 may be implemented following the reading and determining performed in the method 600, for instance, to write additional data or to re-write data onto the first and second memristors 302, 304.

At block 602, a supply voltage may be applied to the source of the transistor 306 of a selected apparatus 300, 300'. For instance, the processor 110 may cause the voltage source 120 to apply the supply voltage through the second and third line 404 of a selected apparatus 300. The supply voltage may be equivalent to a reading voltage level that is relatively lower than a writing voltage level and is thus intended to prevent changing of the second memristor 304 resistance level while providing sufficient voltage to read the resistance level of the second memristor 304. The transistor 306 holds the flow of the supply voltage from being supplied to the input of the second memristor 304 until the gate of the transistor 306 is turned on. According to an example, the supply voltage may be supplied by an analog voltage supply and thus, the voltage level of the supply voltage may be varied in an analog manner.

At block 604, an input voltage may be applied to the input of the first memristor 302 of the selected apparatus 300, 300'. The input voltage may be applied as a voltage spike or pulse that lasts for a shorter period of time than a time window over which the apparatus 300, 300' is to be read. By way of example, the input voltage may be applied for 1 ms. The processor 110 may cause the voltage source 120 to apply an input voltage that is relatively lower than a writing voltage and is thus intended to prevent changing of the first memristor 302 resistance level on providing sufficient voltage to cause the gate of the transistor 306 to be turned on. The flow of the input voltage to the gate of the transistor 306 through the first memristor 302 and the capacitor 308 may be delayed by a time period corresponding to be resistance level of the first memristor 302 and the capacitance of the capacitor 308. That is, for the same capacitance level, the higher the resistance level to which the first memristor 302 has been set, the longer the delay.

Following the delay caused by the first memristor 302 resistance level and the capacitance of the capacitor 308, a charge may be supplied from the capacitor 308 to the gate of the transistor 306. Application of the charge to the gate of the transistor 306 may cause the gate to be turned on, which may cause the supply voltage from the source of the transistor 306 to be outputted through the drain of the transistor 306 and into the input of the second memristor 304 of the selected apparatus 300, 300'. The supply voltage flowing through the second memristor 304 may be reduced by the resistance level of the second memristor 304 prior to the supply voltage being outputted from the second memristor 304.

As shown in FIGS. 4A and 4B, an input signal 410 corresponding to the application of the input voltage through a first input line 402 may be provided to the reader 408. In addition, an output signal 314 corresponding to the supply voltage following transmission of the supply voltage through the second memristor 304 may also be provided to the reader 408. The reader 408 may also be provided with the voltage level of the supply voltage supplied to the supply of the transistor 306. As indicated at block 606, a start of a time window of the application of the input voltage into the first memristor 302 may be determined. For instance, the reader 408 may determine the start of the time window of the application of the input voltage based upon a time at which the input signal 410 supplied into the first memristor 302 was received.

In addition, as indicated at block 608, a delay in a reading voltage outputted from the second memristor 304 may be determined. For instance, the reader 408 may determine the time at which the output signal 314, which may contain the reading voltage, was received from the second memristor 304 and the reader 408 may determine the delay as being equivalent to the difference in time between the time at which the output signal 314 was received and the time at which the input signal 410 was received. As described above, the difference in time between receipt of the input signal 410 and the output signal 314 may correspond to the resistance level of the first memristor 302 because that resistance level delays the time at which the supply voltage is provided to the second memristor 304.

At block 610, a signal value corresponding to the reading voltage outputted from the second memristor 304 may be determined. For instance, the reader 408 may determine the signal value based upon the determined delay and the value of the reading voltage. In another example, the reader 408 may communicate the determined delay and the value of the reading voltage to the processor 110 and a processor 110 may determine the signal value based upon the determined delay and the value of the reading voltage. In a yet further example, the reader 408 may be incorporated into the processor 110 such that the processor 110 performs the functions of the reader 408 disclosed herein. By way of example, the processor 110 may compare the determined delay and the value of the reading voltage to predetermined signal values, e.g., data or information, to determine the signal value to which the determined delay and the reading value correspond. In contrast to conventional memristor apparatuses that include a single memristor, the apparatuses 300, 300' described herein are able to store a relatively larger amounts of information in approximately the same amount of space through use of another memristor that is able to control the delay the timing at which a reading voltage is applied across a memristor having a set resistance level.

Some or all of the operations set forth in the methods 500 and 600 may be contained as utilities, programs, or subprograms, in any desired computer accessible medium. In addition, the methods 500 and 600 may be embodied by computer programs, which may exist in a variety of forms both active and inactive. For example, they may exist as machine readable instructions, including source code, object code, executable code or other formats. Any of the above may be embodied on a non-transitory computer-readable storage medium.

Examples of non-transitory computer-readable storage media include computer system RAM, ROM, EPROM, EEPROM, and magnetic or optical disks or tapes. It is therefore to be understood that any electronic device capable of executing the above-described functions may perform those functions enumerated above.

Figure 7:
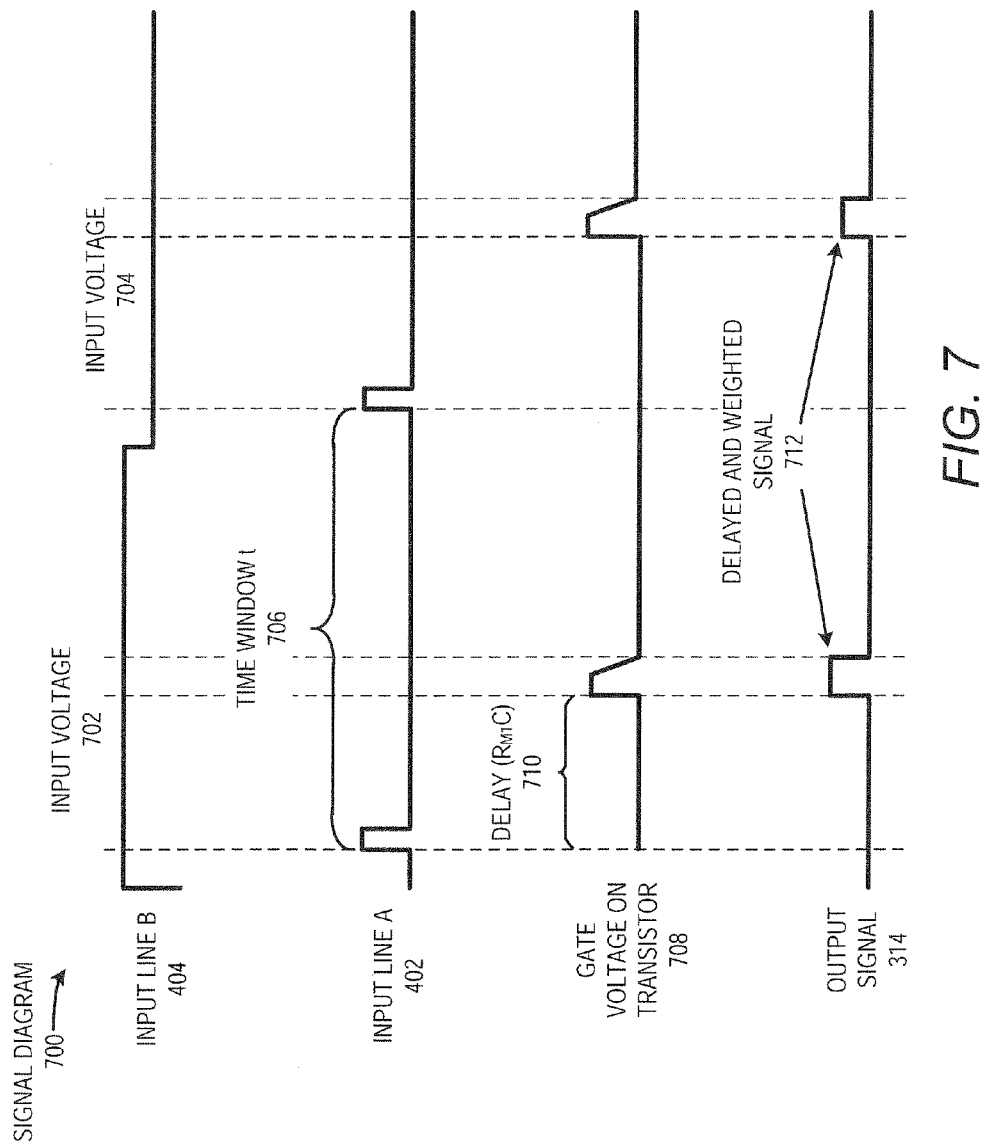
FIG. 7 shows a signal diagram of the apparatuses depicted in FIGS. 3A, 3B during a reading operation, according to an example of the present disclosure.

With reference now to FIG. 7, there is shown a signal diagram 700 of the apparatuses 300, 300' depicted in FIGS. 3A, 3B during a reading operation, according to an example. It should be understood that the signal diagram 700 depicted in FIG. 7 may include additional components and that some of the components described herein may be removed and/or modified without departing from a scope of the signal diagram 700.

Generally speaking, the signal diagram 700 corresponds to some of the operations described above with respect to the method 600 in FIG. 6. The signal diagram 700 depicts signals that may be generated during two time windows. During a first time window t 706, an input or supply voltage 702 may be applied to the source of the transistor 306 through the second input line 404 at a first voltage level, e.g., 1 V. In addition, during a second time window t, an input or supply voltage 704 may be applied to the source of the transistor 306 through the second input line 404 at a first voltage level, e.g., 0.5V. The voltage supply of the input voltage 702 may thus have analog control.

The signal diagram 700 also shows that an input voltage may be applied to the input of the first memristor 302 through the first input line 402 at the start of the first time window t 706 as a voltage spike. The first input line 402 may also be connected to the reader 408 such that the timing at which the first time window t 706 may be tracked and used as a reference to determine the time delay. As also shown in the signal diagram 700, a delay 710 that is equivalent to the resistance level of the first memristor 302 ($R_{M1}$) and the capacitance level of the capacitor 308 (C) may exist prior to the gate voltage 708 of the transistor 306 reaching a sufficient level to cause the gate to be turned on. Responsive to the gate being turned on, the input voltage 702 may be supplied to the second memristor 304 and the second memristor 304 may output an output signal 314 that includes a delayed and weighted signal 712. The signal 712 may be weighted by the resistance level ($R_{M2}$) of the second memristor 304.

The signal diagram further shows that a lower input voltage 704 through the second input line 404 may result in a lower output signal 314. In one regard, the apparatuses 300, 300' disclosed herein are able to generate a weighted spike with a programmable transmission delay from a direct current (DC) analog input source and a time window clock signal. The analog DC analog input source may be, for instance, an analog voltage signal, a capacitor with a sufficient amount of charge, an alternating current (AC) signal with a different spike frequency, etc.

Figure 8:
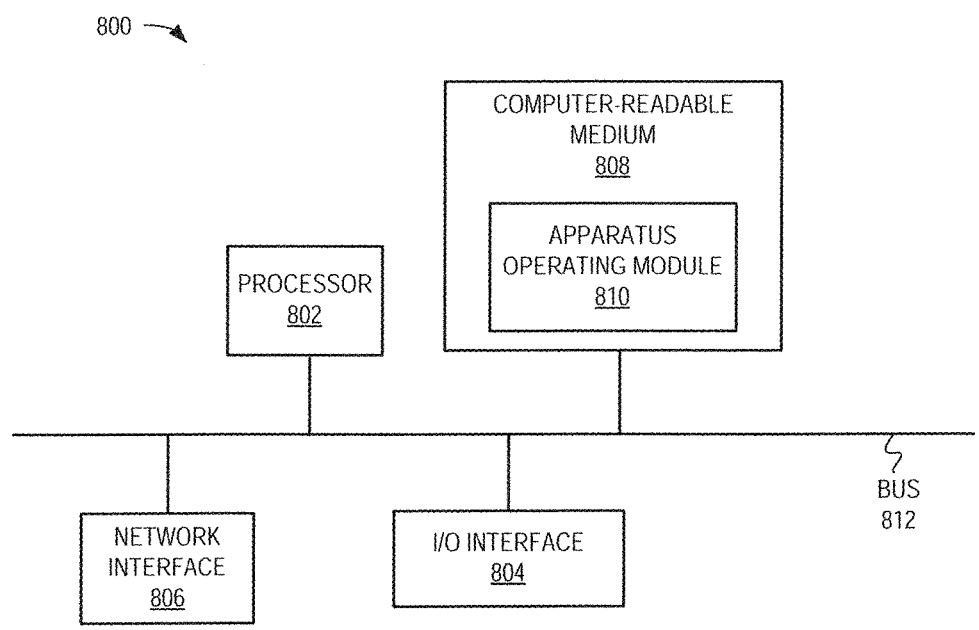
FIG. 8 shows a schematic representation of a computing device, which may be similar to the computing device depicted in FIG. 1, according to an example of the present disclosure.

Turning now to FIG. 8, there is shown a schematic representation of a computing device 800, which may be similar to the computing device 102 depicted in FIG. 1, according to an example. The computing device 800 may include a processor 802, such as the processor 110, and an input/output interface 804. The input/output interface 804 may provide an interface with an input device, such as a keyboard, a mouse, etc., and an output device, such as a display. The computing device 800 may also include a network interface 806, such as a Local Area Network LAN, a wireless 802.11x LAN, a 3G mobile WAN or a WiMax WAN, through which the computing device 800 may connect to a network (not shown). The computing device 800 may further include a computer-readable medium 808 on which is stored sets of machine-readable instructions. Each of these components may be operatively coupled to a bus 812, which may be an EISA, a PCI, a USB, a FireWire, a NuBus, a PDS, or the like.

The computer-readable medium 808 may be any suitable medium that participates in providing instructions to the processor 802 for execution. For example, the computer-readable medium 808 may be non-volatile media, such as an optical or a magnetic disk; volatile media, such as memory. In an example, the computer-readable medium 808 is the memristor array 130 depicted in FIG. 1. In this example, the voltage source 120 and the reader 140 may also be integrated into the computing device 800. In other examples, the voltage source 120 and the reader 140 are separate from the computing device 800.

As shown, the computer-readable medium 808 may store an apparatus operating module 810, which the processor 802 may implement to operate the apparatuses 300, 300' depicted in FIGS. 3A and 3B and the crossbar arrays 400, 400' depicted in FIGS. 4A and 4B. The apparatus operating module 810 may thus be a set of machine readable instructions pertaining to one or both of the methods 500 and 600.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. A memristor apparatus with variable transmission delay, said apparatus comprising:
    a first memristor programmable to have one of a plurality of distinct resistance levels;
    a second memristor;
    a transistor connected between the first memristor and the second memristor; and
    a capacitor having a capacitance, wherein the capacitor is connected between the first memristor and the transistor, wherein application of a reading voltage across the second memristor is delayed by a time period equivalent to the programmed resistance level of the first memristor and the capacitance of the capacitor.

2. The memristor apparatus according to claim 1, wherein the transistor includes a gate, a drain, and a source, and wherein the gate is connected to the first memristor and the capacitor, the source is to be connected to a voltage source, and the drain is connected to the second memristor.

3. The memristor apparatus according to claim 1, wherein the transistor includes a gate layer and wherein at least one of the first memristor and the capacitor is integrated into the gate layer of the transistor.

4. The memristor apparatus according to claim 1, wherein the first memristor is to be connected to a first voltage input line and the transistor is to be connected to a second voltage input, and wherein the transistor is to supply the reading voltage across the second memristor in response to receipt of voltage from both the first voltage input line and the second voltage input line.

5. The memristor apparatus according to claim 4, wherein the second memristor is programmable to have one of a plurality of distinct resistance levels and wherein the second memristor is to be connected to a third voltage input line.

6. The memristor apparatus according to claim 1, wherein the number of the plurality of distinct resistance levels of the first memristor is equivalent to a precision level at which the delay is detectable responsive to a reading voltage pulse over a predefined time window.

7. The memristor apparatus according to claim 1, further comprising:
    a second transistor connected to the first memristor, wherein the second transistor includes a gate, a drain, and a source, and wherein the gate is to be connected to a third voltage input, the source is to be connected to a voltage source, and the drain is connected to an output of the first memristor.

8. A crossbar array comprising:
    a plurality of cells, wherein each of the plurality of cells includes:
        a first memristor programmable to have one of a plurality of distinguishable resistance levels;
        a second memristor connected in series with the first memristor, wherein the second memristor is programmable to have more than one resistance state;
        a capacitor connected to the first memristor; and
        a transistor having a gate, a source, and a drain, wherein the gate is connected to the capacitor and the drain is connected to the second memristor;
    a plurality of first voltage input lines connected to respective inputs of the first memristors; and
    a plurality of second voltage input lines connected to the respective sources of the transistors, wherein application of a reading voltage across the second memristor is delayed by a time period equivalent to the programmed resistance level of the first memristor and the capacitance of the capacitor.

9. The crossbar array according to claim 8, further comprising:
    a plurality of third voltage input lines connected to outputs of the second memristors.

10. The crossbar array according to claim 9, wherein each of the plurality of cells further includes a second transistor having a second gate, a second drain, and a second source, wherein the drain is connected to an output side of the first memristor and to the capacitor;
    wherein the crossbar array further comprises:
        a plurality of fourth voltage lines respectively connected to the second gates; and
        a plurality of supply voltage lines respectively connected to the second sources.

11. The crossbar array according to claim 8, wherein the transistors in the plurality of cells each includes a gate layer and wherein at least one of the first memristor and the capacitor is integrated into the gate layer of the transistor.

12. A method of operating an apparatus with variable transmission delay, said method comprising:
    setting a first memristor to have a first memristor resistance level corresponding to one of a plurality of available time delays; and
    setting a second memristor to have a second memristor resistance level, wherein an output of the first memristor is connected to a capacitor and the capacitor is connected to a gate of a transistor and an input of the second memristor is connected to a drain of the transistor, and wherein a voltage applied through the first memristor to the transistor is delayed by a time period corresponding to the first memristor resistance level and the capacitance of the capacitor.

13. The method according to claim 12, further comprising:
applying a supply voltage to the source of the transistor;
applying an input voltage to an input of the first memristor, wherein supply of a voltage to the transistor gate is delayed by a time period corresponding to the set first memristor resistance level and the capacitance of the capacitor, wherein the transistor is to output a reading voltage through the drain of the transistor to an input of the second memristor in response to receipt of the voltage from the capacitor, and wherein the second memristor is to apply a weight to the reading voltage, wherein the weight corresponds to the set second memristor resistance level.

14. The method according to claim 13, further comprising:
determining a start of a time window through a detection of the application of the first input voltage;
determining a delay in the reading voltage outputted from the second memristor; and
determining a signal value corresponding to the reading voltage outputted from the second memristor.

15. The method according to claim 14, wherein applying the input voltage further comprises applying the input voltage as a voltage spike having a duration that substantially less than a time window over which the signal value is determined.

* * * * *